(12) United States Patent
Zhu et al.

(10) Patent No.: US 9,117,926 B2
(45) Date of Patent: Aug. 25, 2015

(54) SEMICONDUCTOR DEVICES AND METHODS FOR MANUFACTURING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 11 days.

(21) Appl. No.: 14/144,275

(22) Filed: Dec. 30, 2013

(65) Prior Publication Data

US 2014/0131806 A1 May 15, 2014

Related U.S. Application Data

(63) Continuation of application No. PCT/CN2012/085624, filed on Nov. 30, 2012.

(30) Foreign Application Priority Data

Nov. 12, 2012 (CN) .......................... 2012 1 0451050

(51) Int. Cl.
*H01L 21/8234* (2006.01)
*H01L 27/088* (2006.01)
*H01L 21/8238* (2006.01)
*H01L 29/66* (2006.01)

(52) U.S. Cl.
CPC .. *H01L 21/823437* (2013.01); *H01L 21/82385* (2013.01); *H01L 21/823456* (2013.01); *H01L 21/823462* (2013.01); *H01L 21/823468* (2013.01); *H01L 21/823493* (2013.01); *H01L 27/088* (2013.01); *H01L 29/66545* (2013.01); *H01L 29/66553* (2013.01)

(58) Field of Classification Search
None
See application file for complete search history.

(56) References Cited

U.S. PATENT DOCUMENTS

| | | | |
|---|---|---|---|
| 5,187,112 A | 2/1993 | Kohno et al. | |
| 2002/0127791 A1* | 9/2002 | Nanjo et al. | 438/231 |
| 2010/0108980 A1 | 5/2010 | Chen | |
| 2011/0095348 A1* | 4/2011 | Chakihara et al. | 257/298 |

FOREIGN PATENT DOCUMENTS

| | | |
|---|---|---|
| JP | 2012028562 A | 2/2012 |
| KR | 100866260 B1 | 10/2008 |

OTHER PUBLICATIONS

International Search Report and Written Opinion dated Aug. 22, 2013, issued in International Appl. No. PCT/CN2012/085624, filed Nov. 12, 2012, with accompanying English translation of the Written Opinion.

* cited by examiner

*Primary Examiner* — Fei Fei Yeung Lopez
(74) *Attorney, Agent, or Firm* — Knobbe Martens Olson & Bear LLP

(57) ABSTRACT

A semiconductor device and a method of manufacturing the same is disclosed. In one aspect, the method comprises forming a first MOSFET having a first gate length in a semiconductor substrate, and forming a second MOSFET having a second gate length in the semiconductor substrate. Furthermore, the second gate length is less than the first gate length, and wherein the second MOSFET has a gate stack in the form of a spacer having a gate conductor and a gate dielectric isolating the gate conductor from the semiconductor substrate.

8 Claims, 14 Drawing Sheets

SEMICONDUCTOR DEVICES AND
METHODS FOR MANUFACTURING THE
SAME

RELATED APPLICATIONS

This application claims priority to International Application No. PCT/CN2012/085624, filed on Nov. 30, 2012, and Chinese Patent Application No. 201210451050.2, entitled "SEMICONDUCTOR DEVICES AND METHODS FOR MANUFACTURING THE SAME," filed on Nov. 12, 2012, which are incorporated herein by reference in their entirety.

BACKGROUND

1. Field

The disclosed technology relates to the semiconductor field, and particularly, to semiconductor devices integrating Metal Oxide Semiconductor Field Effect Transistor (MOSFET) having different gate lengths and methods for manufacturing the same.

2. Description of the Related Technology

With continuous scaling down of semiconductor devices, short channel effects are becoming more significant. Thus, a gate stack configuration comprising a high-K gate dielectric and a metal gate conductor is proposed. To avoid degradation of the gate stack, semiconductor devices with such a gate stack configuration are manufactured generally by means of the replacement gate process. The replacement gate process involves forming the high-K gate dielectric and the metal gate conductor in a gap defined between gate spacers. However, it is becoming more and more difficult to form the high-K dielectric and the metal gate conductor in the small gate opening due to the scaling down of the semiconductor devices.

Thus, it is desirable to a method for manufacturing and integrating a MOSFET with a small gate size. It is more desirable to a method for integrating MOSFETs having different gate lengths in one semiconductor substrate.

SUMMARY OF CERTAIN INVENTIVE ASPECTS

The objective of the disclosed technology is at least partially to provide a method for integrating MOSFET with different gate lengths.

According to an aspect of the disclosed technology, there is provided a method for manufacturing a semiconductor device, comprising: forming a first MOSFET having a first gate length in a semiconductor substrate; and forming a second MOSFET having a second gate length in the semiconductor substrate, wherein the second gate length is smaller than the first gate length, and wherein the second MOSFET has a gate stack in the form of a spacer having a gate conductor and a gate dielectric isolating the gate conductor from the semiconductor substrate.

According to a further aspect of the disclosed technology, there is provided a semiconductor device, comprising: a semiconductor substrate; a first MOSFET located in the semiconductor substrate and having a first gate length; and a second MOSFET located in the semiconductor substrate and having a second gate length; wherein the second gate length is smaller than the first gate length, and wherein the second MOSFET has a gate stack in the form of a spacer having a gate conductor and a gate dielectric located between the gate conductor and the semiconductor substrate.

The disclosed technology forms gate stacks with different structures for the first MOSFET and the second MOSFET, wherein the first MOSFET comprises a conventional gate stack and the second MOSFET comprises a gate stack in the form of a spacer. Thus, the gate length of the second MOSFET may be much smaller than the gate length of the first MOSFET. The disclosed technology provides a method for integrating MOSFETs with different gate lengths on one semiconductor substrate. In the preferred embodiment of the disclosed technology, it firstly forms a sacrificial spacer and then replaces the sacrificial spacer with a gate stack, which may reduce the usage of masks and the requirement for the complex photolithography process, thereby decreasing the cost for manufacture.

BRIEF DESCRIPTION OF THE DRAWINGS

The above and other objects, features, and advantages of the disclosed technology will become apparent from following descriptions of embodiments of the disclosed technology with reference to the attached drawings, in which.

Figure 1:
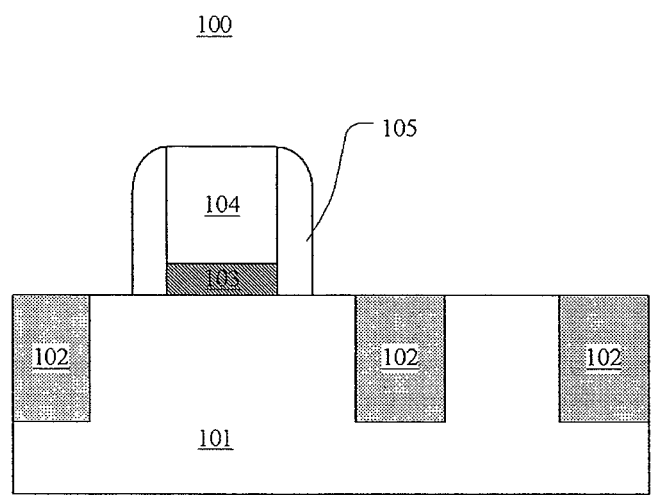
FIGS. 1-11 are schematic views showing a flow of manufacturing a semiconductor device according to a first embodiment of the disclosed technology.

DETAILED DESCRIPTION OF CERTAIN
ILLUSTRATIVE EMBODIMENTS

Exemplary embodiments of the disclosed technology will be described in more details below with reference to the accompanying drawings. In the drawings, like reference numerals denote like members. The respective portions of the figures are not drawn to scale, for the sake of clarity.

For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

When a situation in which one layer being "directly on" another layer or region, the expression of "directly on" or "directly on and adjacent to" are employed.

In the present application, the phrase "semiconductor structure" means generally the whole semiconductor structure formed at each step of the method for manufacturing the semiconductor device, including all of the layers and regions having been formed. Some particular details of the disclosed technology will be described below, such as exemplary semiconductor structures, materials, dimensions, process steps and technologies of the semiconductor device, for better understanding of the disclosed technology. However, it can be understood by one skilled person in the art that these details are not always essential for but can be varied in a specific implementation of the disclosed technology.

Unless the context clearly indicates otherwise, each part of the MOSFET can be made of material(s) well known to one skilled person in the art. A semiconductive material comprises such as a group III-V semiconductor, for example, GaAs, InP, GaN, or SiC, and a group IV semiconductor, for example, Si or Ge. A gate conductor may be made of any conductive material, such as metal, doped polysilicon, a stack gate conductor of metal and doped polysilicon and other conductive material, among others, for example, TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, Ni3Si, Pt, Ru, Ir, Mo, HfRu, RuOx, and their combinations. A gate dielectric is made of $SiO_2$ or other material which has a dielectric constant larger than that of $SiO_2$, such as an oxide, a nitride, an oxynitride, a silicate, an aluminate, and a titanate. The oxide includes for example $SiO_2$, $HfO_2$, $ZrO_2$, $Al_2O_3$, $TiO_2$, $La_2O_3$. The nitride includes for example $Si_3N_4$. The silicate includes for example HfSiOx. The aluminate includes for example $LaAlO_3$. The titanate includes for example $SrTiO_3$. The oxynitride includes for example SiON. Moreover, the gate dielectric may be made of those developed for the gate dielectric in the future, besides the above known materials for those skilled in the art.

In the conventional process, after source and drain regions are formed in a substrate with the aid of a "dummy" gate stack and spacers on opposite sides of the dummy gate stack, the spacers on both sides are reserved to define a gap therebetween, and a true gate stack can be formed by filling the gap. In contrast, the disclosed technology proposes a "replacement spacer" process. Specifically, after source and drain regions are formed, material layer(s) present on the side of either one of the source and drain regions is (are) reserved, and a gate stack (particularly, a gate conductor) is formed in the form of spacer on a sidewall of the reserved material layer(s). In this way, formation of the gate stack is done in a relatively large space (substantially corresponding to a gate region+the other of the source and drain regions). This process is easier to perform as compared with the conventional process where formation of the gate stack is done in the small gate opening between the spacers.

The disclosed technology can be presented in various ways, some of which will be described in the following by way of example.

A flow of manufacturing a semiconductor device according to a first embodiment of the disclosed technology is described with reference to FIGS. 1-11.

As shown in FIG. 1, a substrate 100 is provided. The substrate 100 may be any suitable substrate, including, but not limited to, a semiconductor material substrate such as a bulk Si substrate, a Semiconductor On Insulator (SOI) substrate, a SiGe substrate, and the like. In the following, the substrate is described as a bulk Si substrate for convenience. On the substrate 100, Shallow Trench Isolations (STIs) 102 can be formed to isolate active regions of individual devices. For example, the STIs 102 may comprise oxide (e.g., silicon oxide). It should be pointed out that in the example of the following description, there is only a situation in which only two semiconductor devices are formed for convenience, in which the STI 102 defines the active regions of the two semiconductor devices at the left and right sides of FIG. 1. However, the disclosed technology is not limited thereto, and is also applicable to formation of more semiconductor devices.

A first MOSFET 100 is formed on the semiconductor substrate 101 by employing a conventional process. A first active region of the first MOSFET 100 is the left side region defined by the STI 102 in FIG. 1. The first MOSFET 100 comprises a gate stack formed on the semiconductor substrate, the gate stack including a gate dielectric 103 located on the semiconductor substrate 101 and a gate conductor 104 located on the gate dielectric 103. The dielectric 103 separates the gate conductor 104 from the semiconductor substrate 101. A spacer 105 is formed around the gate conductor 104. The first MOSFET 100 further comprises source/drain regions (not shown), an extending region (not shown) and an optional halo region (not shown) formed in the semiconductor substrate 101.

As understood by those skilled in the art, the first MOSFET 100 may be manufactured by employing various processes, for example, by employing the known "gate-first process" or "replacement-gate process".

Next, a first shielding layer 106 with a thickness of about 100-200 nm can be formed on the surface of the semiconductor structure by means of a known deposition process, such as CVD (Chemical Vapor Deposition), atomic layer deposition, sputtering and the like. The first shielding layer 106 may be formed of an oxide (e.g. silicon oxide).

Then, a photo resist layer (not shown) is formed on the first shielding layer 106 by spin coating, and the photo resist layer is patterned by a photolithography process including exposure and development. By utilizing the photo resist layer as a mask, the portion of the first shielding layer 106 which is located at the right region of FIG. 1 (i.e. the second active region surrounded by STI 102) is removed by dry etching such as ion beam milling etching, plasma etching, reactive ion etching, laser ablation, or wet etching using etching agent solution. The photo resist layer is removed by dissolving in the solvent or ashing.

Figure 2:
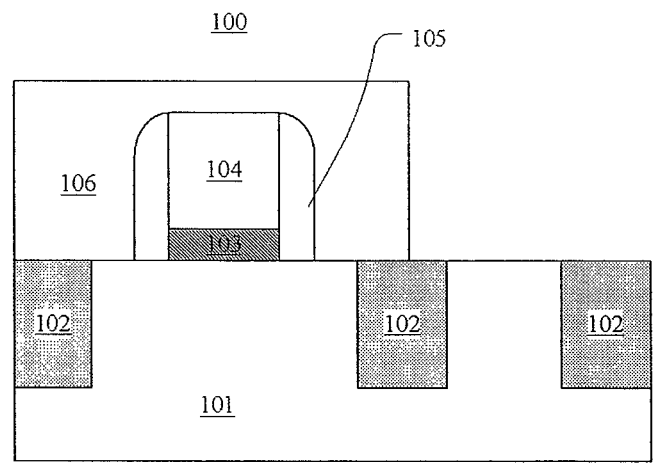

After the step of patterning mentioned above, the first shielding layer 106 only covers the first active region of the first MOSFET 100, as shown in FIG. 2.

Next, a second shielding layer 107 with a thickness of about 100-200 nm may be formed on the surface of the semiconductor substrate by the known deposition process mentioned above. The second shielding layer 107 may be formed of a nitride (e.g. silicon nitride). Preferably, the second shielding layer 107 may comprise a nitride layer and an oxide layer located above the nitride layer. The second shielding layer 107 is planarized by utilizing the first shielding layer 106 as a stop layer, e.g. by Chemical Mechanical Polishing (CMP), so as to obtain a flattening surface of the semiconductor structure. As a result, the first shielding layer 106 is adjacent to the second shielding layer 107, the first shielding layer 106 covers the first active region of the first MOSFET 100, and the second shielding layer 107 covers the second active region of the second MOSFET to be formed.

Figure 3:
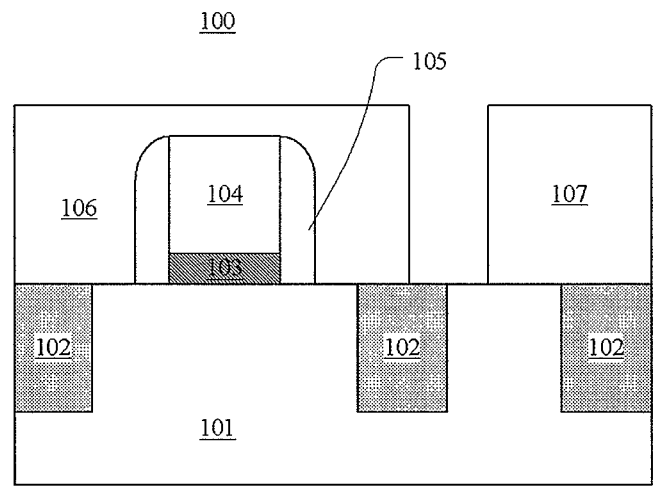

For example, by utilizing a photo resist mask, an opening is formed in the second shielding layer 107 by the step of patterning mentioned above, the opening exposing the surface of a part of the semiconductor substrate 101 in the second active region. Preferably, the opening is adjacent to the first shielding layer 106 and exposes a part of STI 102 between the first active region and the second active region, as shown in FIG. 3. The opening exposes a portion of the semiconductor substrate 101 to be formed as one of the source region and the drain region.

Next, a first ion implantation can be carried out along a direction perpendicular to the main surface of the semiconductor substrate 101 to form an extension region 108a. During the first ion implantation, for a p-type device, the implantation can be done by implanting p-type impurities such as In, $BF_2$ or B; for a n-type device, the implantation can be done by implanting n-type impurities such as As or P, to form the extension region.

Figure 4:
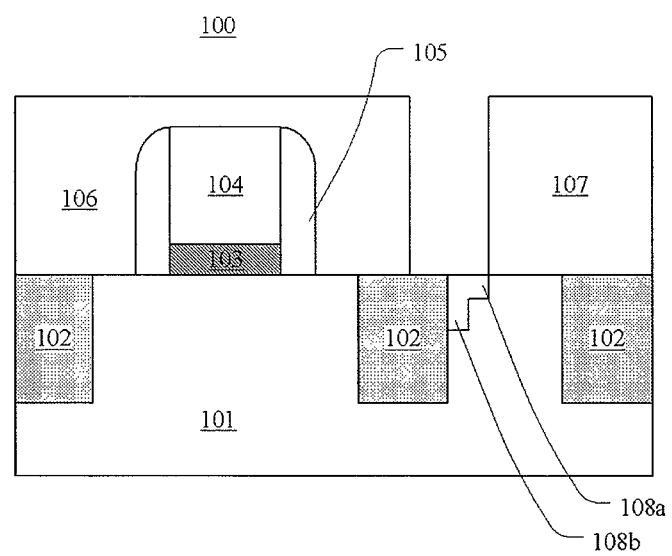

Then, a second ion implantation can be carried out along a direction inclining to the main surface of the semiconductor substrate 101 to form a region 108b of the source region and the drain region. The direction for the second ion implantation is declined some angle (less than 90 degree, e.g. 15 degree) in clockwise direction with respect to the direction of the first ion implantation, so that during the second ion implantation, the second shielding layer 107 blocks a portion of the ions. As a result, the implanted ions enter into the semiconductor substrate 101 only at the position close to the STI 102 so as to form one of the source region and the drain region. The depth for the second ion implantation is deeper than the depth for the first ion implantation. During the second ion implantation, for a p-type device, the p-type impurities mentioned above can be employed; for a n-type device, the n-type impurities mentioned above can be employed. As understood by those skilled in the art, the extension region 108a may have an overlap with one region 108b of the source region and the drain region, and there is not a distinct boundary between them, as shown in FIG. 4.

Alternatively, halo (not shown) may be formed by carrying out additional ion implantation through the opening before the first ion implantation. The direction for the additional ion implantation is declined some angle (less than 90 degree, e.g. 15 degree) in counterclockwise direction with respect to the direction of the first ion implantation, so that during the additional ion implantation, the first shielding layer 106 blocks a portion of the ions. As a result, the implanted ions enter into the semiconductor substrate 101 only at the position away from the STI 102 so as to form a halo. The depth for the additional ion implantation is deeper than the depths for the first ion implantation and the second ion implantation. During the additional ion implantation, for a p-type device, the n-type impurities mentioned above can be employed; for an n-type device, the p-type impurities mentioned above can be employed.

Alternatively, annealing, such as spike annealing, laser annealing, and flash annealing, can be performed to activate the implanted impurities after the second ion implantation.

Figure 5:
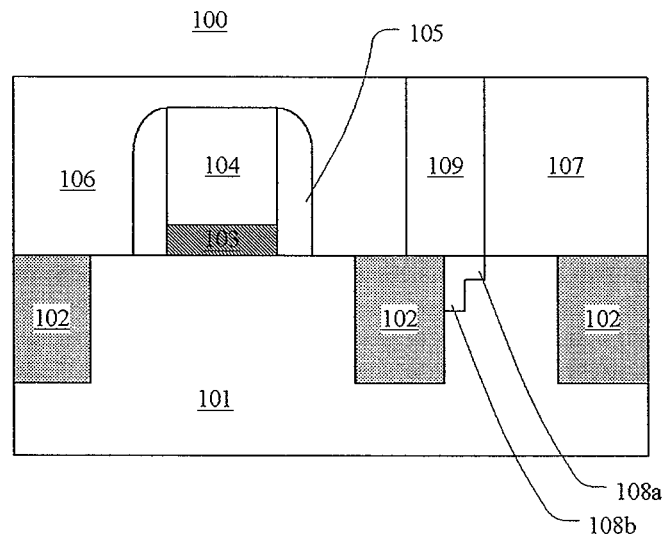

Next, a third shielding layer 109 (e.g. oxide) is formed on the semiconductor structure by the known deposition process, and the material of the third shielding layer 109 fill the opening. A planarization process such as CMP is performed to obtain a flattening surface of the semiconductor structure, as shown in FIG. 5. The material of the third shielding layer 109 for filling the opening may be identical to that of the first shielding layer 106. If the second shielding layer 107 comprises a nitride layer and an oxide layer, the step of CMP only needs to be stopped at the nitride.

Next, by employing appropriate etching agent, the second shielding layer 107 is selectively removed with respect to the first shielding layer 106 and the third shielding layer 109 by dry etching or wetting etching mentioned above, as shown in FIG. 6. Such an etching is stopped on the surface of the semiconductor substrate 101. Preferably, an additional oxide layer (not shown) may be provided on the surface of the semiconductor substrate 101 so as to provide selectivity for etching.

Figure 7:
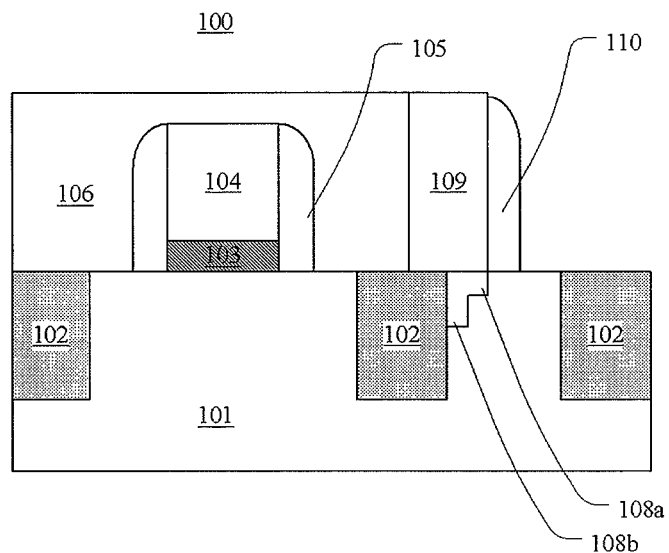

Next, a nitride layer with a thickness of e.g. 8-30 nm is deposited on the surface of the semiconductor structure by a known deposition process mentioned above, and then a sacrificial spacer 110 is formed on the sidewall of the first shielding layer 106 by anisotropic etching, as shown in FIG. 7. The formation and material of the sacrificial spacer 110 are identical to those of the conventional gate spacer. As illustrated in the following, the sacrificial spacer 110 may be removed finally and be replaced by the gate stack.

Figure 8:
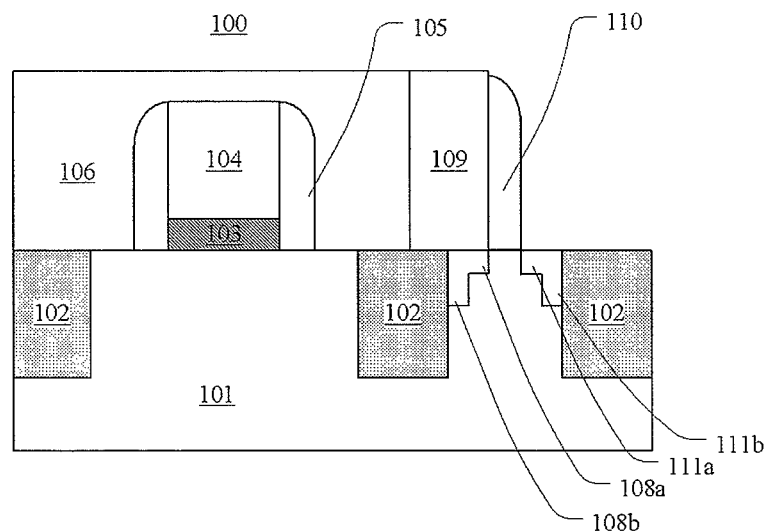

Next, by employing the sacrificial spacer 110 as a hard mask, an extension region 111a and the other one of the the source region and the drain region are formed in the semiconductor substrate 101 by a third ion implantation and a fourth ion implantation according to the method illustrated by reference to FIG. 4, as shown in FIG. 8.

Alternatively, an additional ion implantation may be carried out to form a halo (not shown) before the third ion implantation.

Alternatively, annealing, such as spike annealing, laser annealing, and flash annealing, can be performed to activate the implanted impurities after the fourth ion implantation.

Next, by employing appropriate etching agent, the sacrificial spacer 110 is selectively removed with respect to the first shielding layer 106 and the third shielding layer 109 by dry etching or wetting etching mentioned above.

Figure 9:
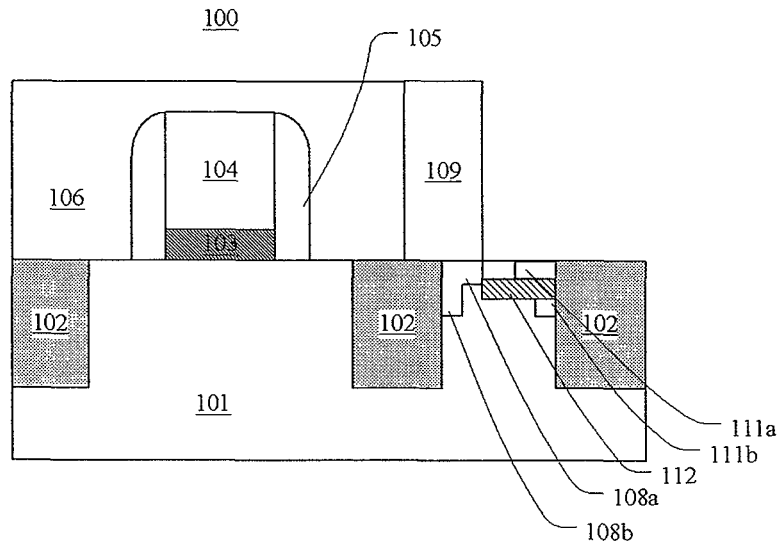

Alternatively, in order to better control the short-channel effect and to suppress the leakage between energy bands, a super steep retrograded well (SSRW) 112 is formed by a fifth ion implantation (as shown by the arrow in the figure), as shown in FIG. 9. For example, for a p-type device, the implantation can be done by implanting n-type impurities such as As or P or Sb; and for a n-type device, the implantation can be done by implanting p-type impurities such as In, $BF_2$ or B to form the SSRW, thereby effectively improving the leakage current between the energy bands. Here should be pointed out that the SSRW 112 in FIG. 9 is only for convenience of illustration and is shown as a regular rectangular shape. In fact, the shape of the SSRW 112 is determined by the implantation process and may not have a definite boundary.

Figure 10:
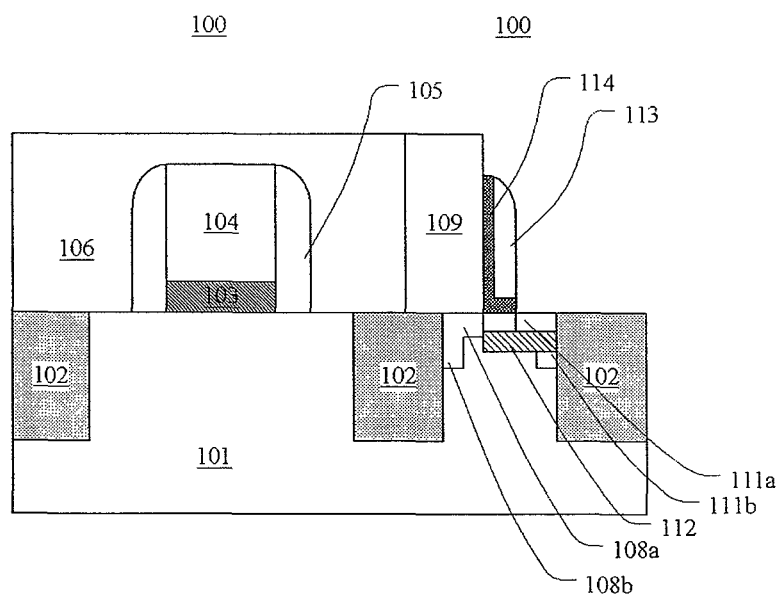

Next, a conformal dielectric layer (e.g. $HfO_2$) and a gate conductor layer (e.g. a polysilicon) are formed in turn on the surface of the semiconductor structure by a known deposition process. An anisotropic etching is performed on the conductor layer to remove the portion of the conductor layer which extends in parallel to the main surface of the semiconductor substrate 101. The portion of the gate conductor layer which extends vertically on the side wall of the third shielding layer 109 is reserved to form a gate conductor 113 in the form of a spacer. Furthermore, by employing the gate conductor 113 as a hard mask and employing appropriate etching agent, the exposed portion of the dielectric layer is selectively removed with respect to the gate conductor 113 and the third shielding layer 109 to form a gate dielectric 114. The gate stack comprises a gate dielectric 114 and a gate conductor 113, in which the gate dielectric 114 separates the gate conductor 113 from the semiconductor substrate 101, as shown in FIG. 10.

The thickness of the dielectric layer is about 2-4 nm. The thickness of the gate conductor is about 9-30 nm. As a result, the resultant gate conductor 113 is approximately aligned with the sacrificial spacer 110 as shown in FIG. 7 by controlling the thickness of the gate conductor layer, so that the formed gate conductor 113 is approximately aligned with the extension region 111a and the other one 111b of the source region and the drain region.

Alternatively, a work function adjustment layer (not shown) may be formed between the gate conductor 113 and the gate dielectric 114. For example, the work function adjustment layer may comprise any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, $Ni_3Si$, Pt, Ru, Ir, Mo, HfRu, $RuO_x$, or any combination thereof, with a thickness of about 2-10 nm. As known for those skilled in the art, the work function adjustment layer is a preferred layer and a gate stack (e.g. $HfO_2$/TiN/poly-silicon) comprising a work function adjustment layer may advantageously obtain a reduced leakage current of the gate.

As a result, a second MOSFET 12 comprising extending regions 108a, 111a, source/drain regions 108b, 111b, SSRW 112, a gate conductor 113 and a gate dielectric 114 is formed in a second active region.

Figure 11:
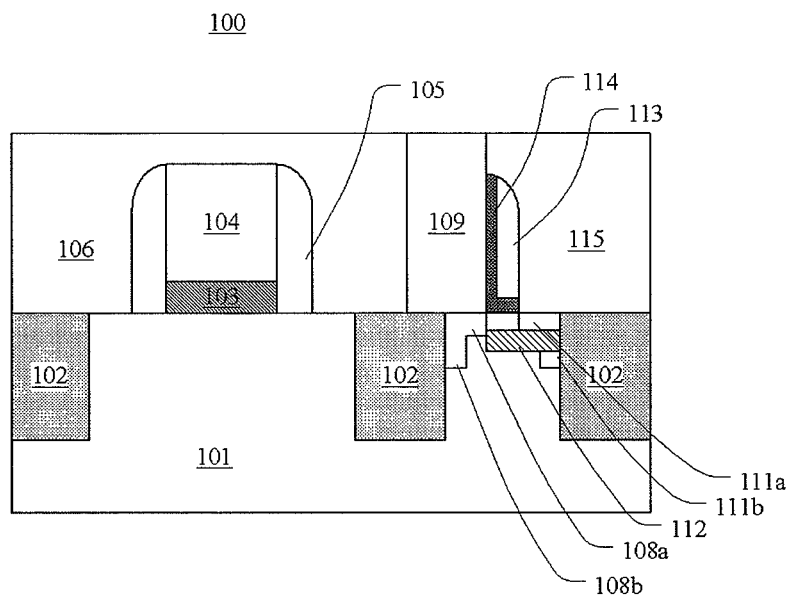

Next, a dielectric layer 115 is formed on the semiconductor structure by a known deposition process mentioned above. The dielectric layer 115 is planarized for example by Chemical Mechanical Polishing (CMP) to obtain a flattening surface of the semiconductor structure, as shown in FIG. 11. It is shown in the figure that only the portion of the dielectric layer 115 which covers the second MOSFET is reserved. Alternatively, the dielectric layer 115 may cover both of the first MOSFET and the second MOSFET. The first shielding layer 106, the third shielding layer 109 and the dielectric layer 115 together function as an inter-layer dielectric (ILD).

A flow of manufacturing a semiconductor device according to a second embodiment of the disclosed technology is described with reference to FIGS. 12-19. In the second embodiment, the elements corresponding to the first embodiment are indicated with similar reference signs and the detailed description for the material, structure and manufacturing process thereof are omitted.

Figure 12:
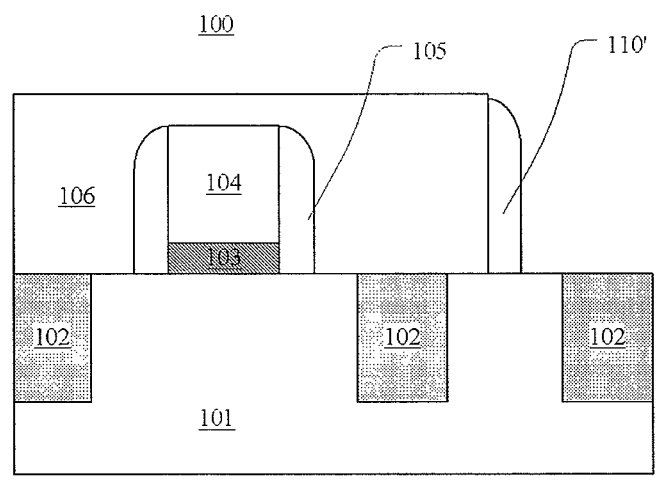
FIGS. 12-19 are schematic views showing some steps of a flow of manufacturing a semiconductor device according to a second embodiment of the disclosed technology.

Continued to the step shown in FIG. 1 and similar to the step shown in FIG. 2, a first shielding layer 106 is formed on the surface of the semiconductor structure and the first shielding layer 106 is patterned. After the step of patterning, the first shielding layer 106 not only covers the first active region of the first MOSFET 100, but also covers a portion of the second active region of the second MOSFET to be formed. Next, similar to the step shown in FIG. 7, a sacrificial spacer 110' is formed on the sidewall of the first shielding layer 106 which is exposed by an opening, as shown in FIG. 12.

Figure 13:
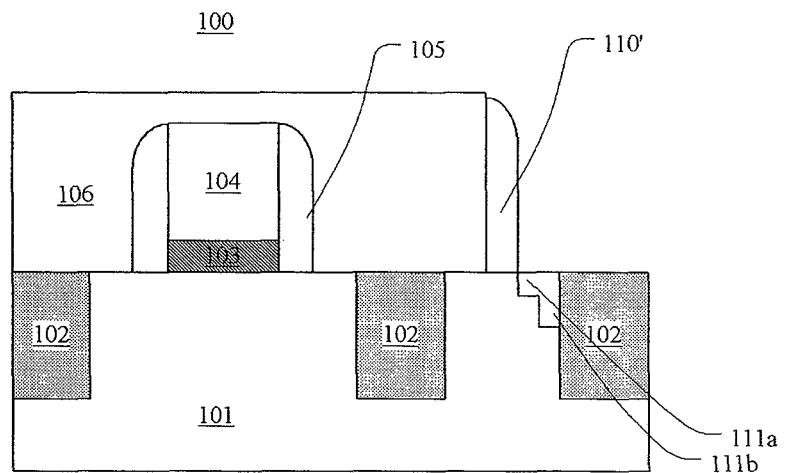

Next, similar to the step shown in FIG. 8, by employing the first shielding layer 106 and the sacrificial spacer 110' as a hard mask, an extension region 111a and the other one 111b of the source region and the drain region are formed in the semiconductor substrate 101 by a first ion implantation and a second ion implantation, as shown in FIG. 13.

Figure 14:
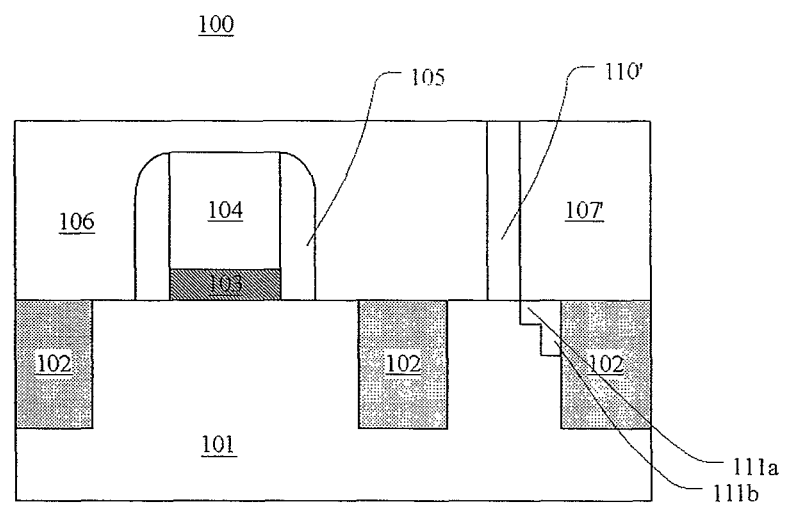

Next, a second shielding layer 107' is formed on the surface of the semiconductor structure. The first shielding layer 106 and the second shielding layer 107' are planarized so that the second shielding layer 107' is leveled to the first shielding layer 106 and the top surface of the sacrificial spacer 110' is exposed, as shown in FIG. 14.

Figure 15:
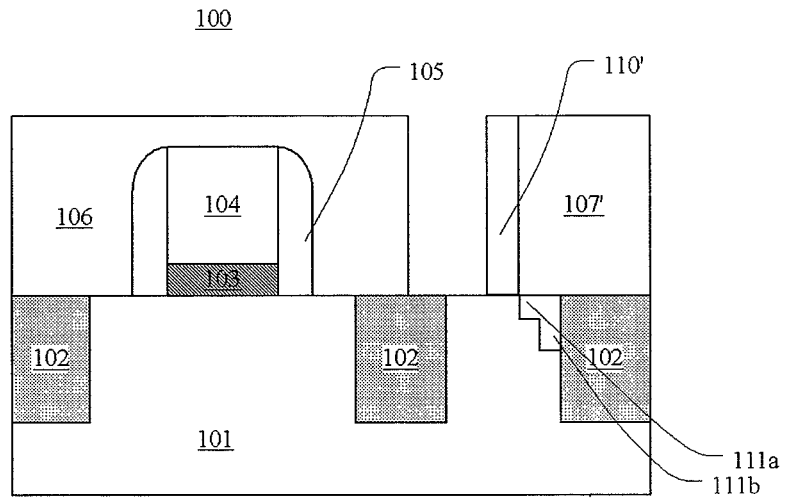

Next, the first active region of the first MOSFET 100 is shielded by employing a photo resist mask, and a portion of the first shielding layer 106 (such as silicon nitride) is selectively etched with respect to the second shielding layer 107' (such as silicon oxide) and the sacrificial spacer 110' (such as poly-silicon or amorphous silicon), so as to form an opening exposing the surface of one portion of the semiconductor substrate 101 in the second active region, as shown in FIG. 15. For example, such a selective etching may be performed by a pyrophosphoric acid.

Figure 16:
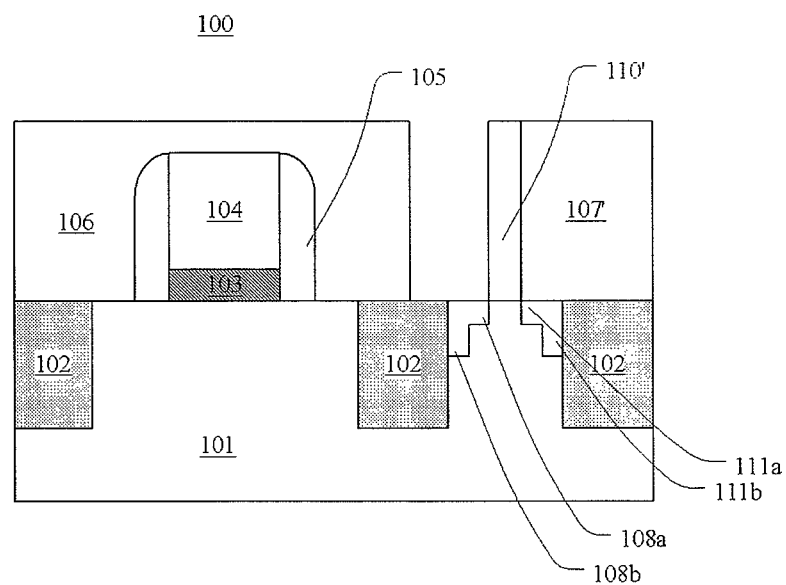

Next, similar to the step shown in FIG. 8, by employing the first shielding layer 106, the second shielding layer 107' and the sacrificial spacer 110' as a hard mask, an extension region 108a and the other one 108b of the source region and the drain region are formed in the semiconductor substrate 101 by a third ion implantation and a fourth ion implantation, as shown in FIG. 16.

Figure 17:
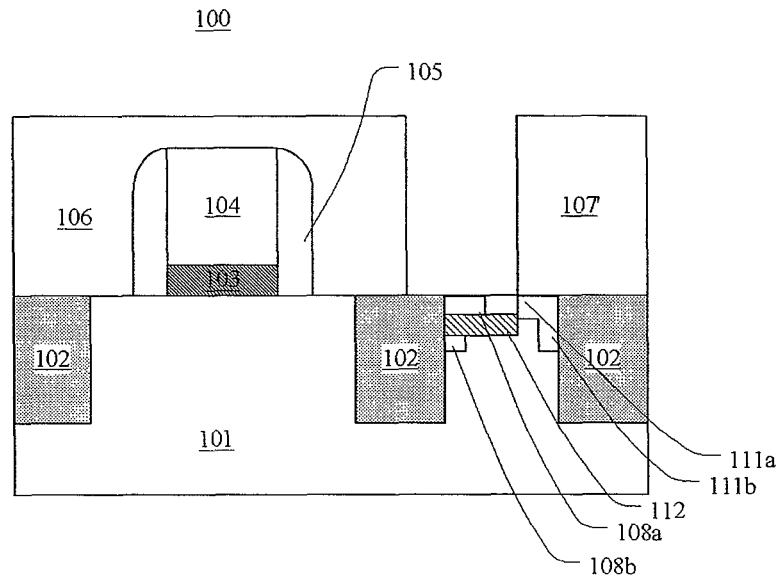

Next, similar to the step shown in FIG. 9, the sacrificial spacer 110' is selectively removed with respect to the first shielding layer 106 and the second shielding layer 107' by etching. Alternatively, a super steep retrograded well (SSRW) 112 is formed by a fifth ion implantation via an opening, as shown in FIG. 17.

Figure 18:
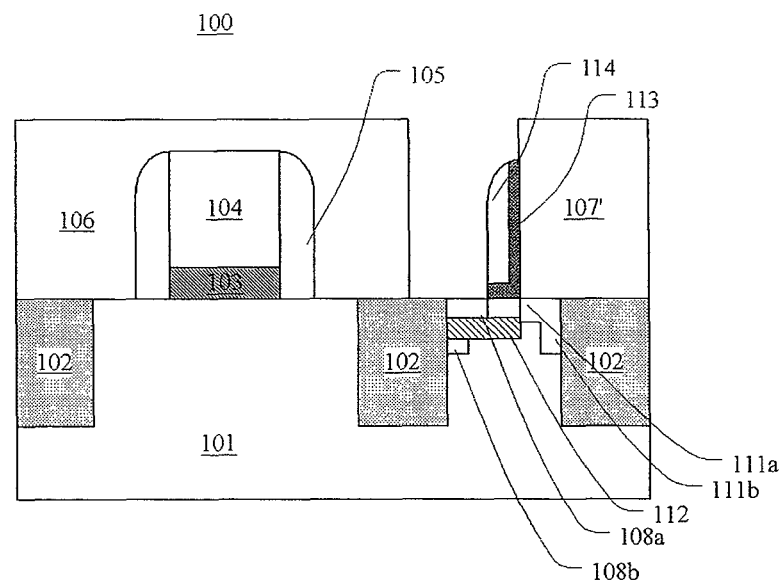

Next, similar to the step shown in FIG. 10, a gate stack is formed on a sidewall of the second shielding layer 107' exposed by the opening, the gate stack including a gate conductor 118 and a gate dielectric 113 located between the gate conductor 118 and the semiconductor 101, as shown in FIG. 18. Alternatively, a work function adjustment layer (not shown) may be further formed between the gate conductor 113 and the gate dielectric 114.

Figure 19:
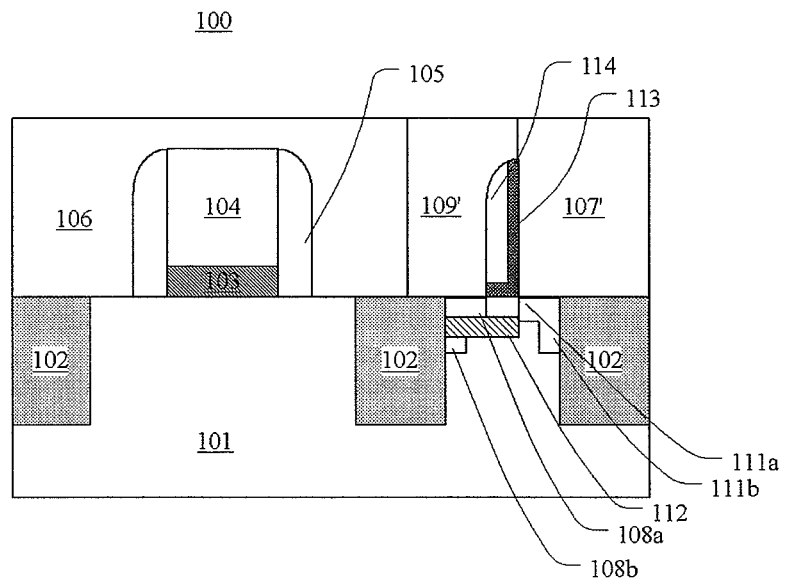

Next, similar to the step shown in FIG. 5, a third shielding layer 109' is formed on the semiconductor structure to fill the opening, as shown in FIG. 19.

A flow of manufacturing a semiconductor device according to a third embodiment of the disclosed technology is described with reference to FIGS. 20-27. In the third embodiment, the elements corresponding to the first embodiment are indicated with similar reference signs and the detailed description for the material, structure and manufacturing process thereof are omitted.

Figure 20:
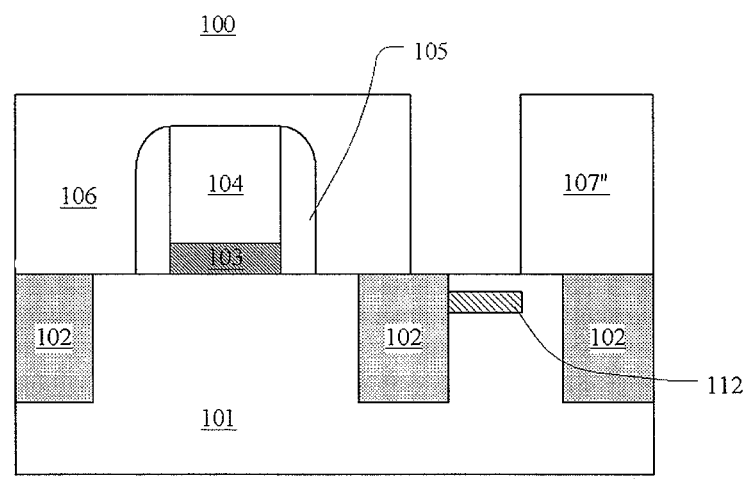
FIGS. 20-27 are schematic views showing some steps of a flow of manufacturing a semiconductor device according to a third embodiment of the disclosed technology.

Continued to the step shown in FIG. 2 and similar to the step shown in FIG. 3, after a first shielding layer 106 is formed, a second shielding layer 107" is formed to cover the second active region of the second MOSFET to be formed. An opening is formed in the second shielding layer 107". Then, the difference of the present step from the step shown in FIG. 3 lies in that the opening exposes some portion of the semiconductor substrate 101 to be formed as one of the source region and the drain region as well as some portion (which is formed to function as the channel region) of the semiconductor substrate 101 adjacent to one of the source region and the drain region. Next, similar to the step shown in FIG. 9, alternatively, a super steep retrograded well (SSRW) 112 is formed in the semiconductor substrate 101 by a first ion implantation through the opening, as shown in FIG. 20.

Figure 21:
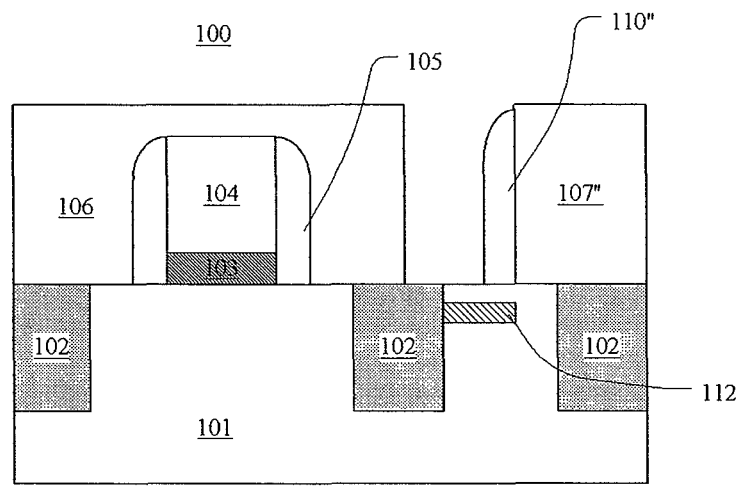

Then, similar to the step shown in FIG. 7, a sacrificial spacer 110" is formed on one sidewall of the second shielding layer 107" exposed by the opening, as shown in FIG. 21.

Figure 22:
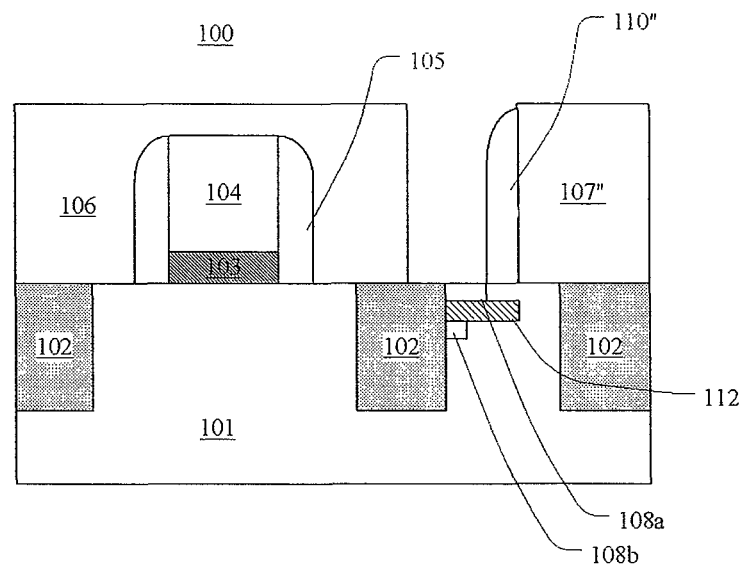

Next, similar to the step shown in FIG. 4, by employing the sacrificial spacer 110" as a hard mask, an extension region 108a is formed by a second ion implantation through the opening. Next, a third ion implantation is performed along a direction inclined to the main surface of the semiconductor substrate 101 to form one region 108b of the source region and the drain region, as shown in FIG. 22. After the third ion implantation, alternatively, an additional ion implantation is performed to form a halo, or further alternatively, an anneal process is performed to activate the implanted impurities.

Figure 23:
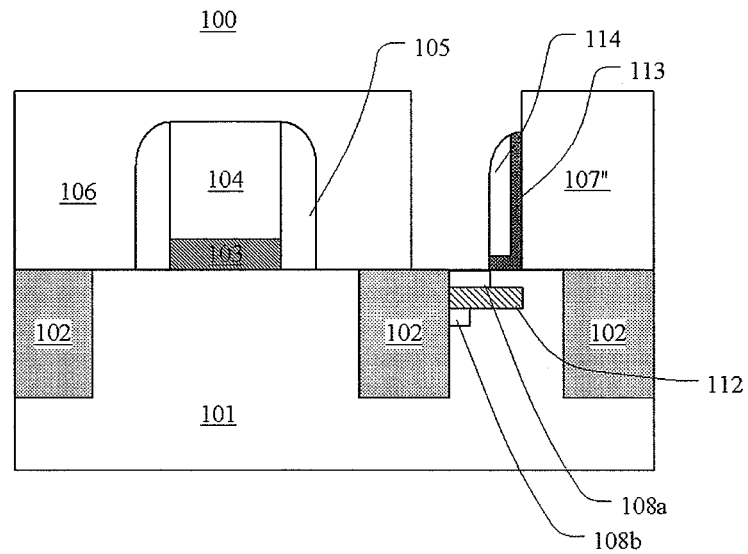

Next, by employing appropriate etching agent, the sacrificial spacer 110" is selectively removed with respect to the first shielding layer 106 and the second shielding layer 107" by dry etching or wetting etching mentioned above. Next, similar to the step shown in FIG. 10, a gate stack is formed on one sidewall of the second shielding layer 107" exposed by the opening, the gate stack including a gate conductor 118 and a gate dielectric 113 located between the gate conductor 118 and the semiconductor substrate 101, as shown in FIG. 23. Alternatively, a work function adjustment layer (not shown) may be further formed between the gate conductor 113 and the gate dielectric 114.

Figure 24:
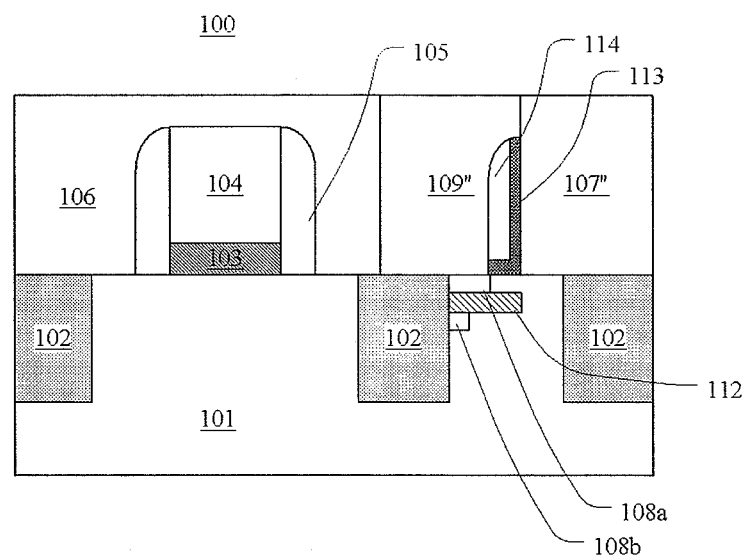
Figure 25:
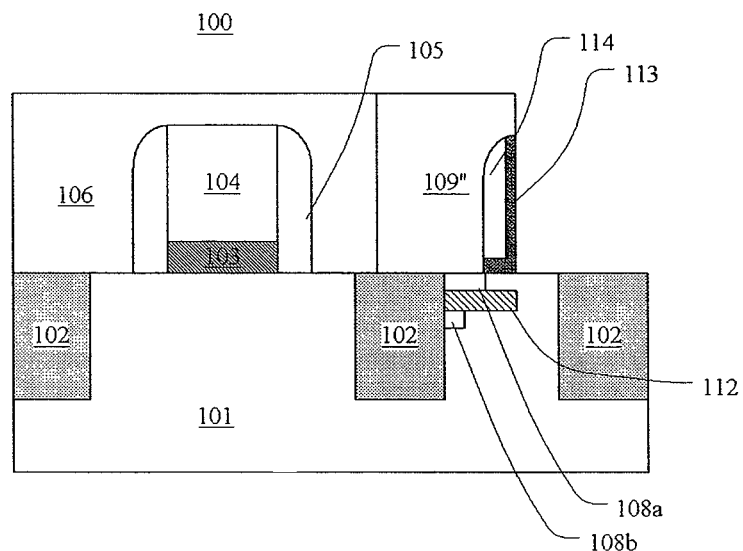

Next, similar to the step shown in FIG. 5, a third shielding layer 109" is formed on the semiconductor structure to fill the opening in the second shielding layer 107", as shown in FIG. 24.

Figure 6:
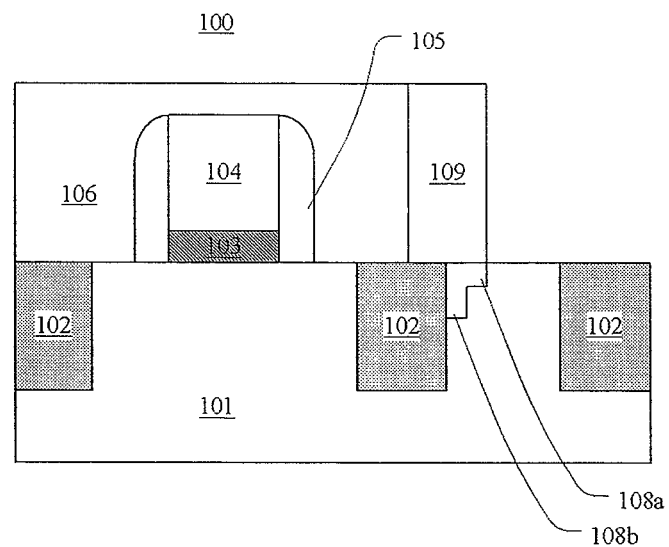

Next, similar to the step shown in FIG. 6, by employing appropriate etching agent, the second shielding layer 107" is selectively removed with respect to the first shielding layer 106 and the third shielding layer 109" by dry etching or wetting etching mentioned above, as shown in FIG. 25.

Figure 26:
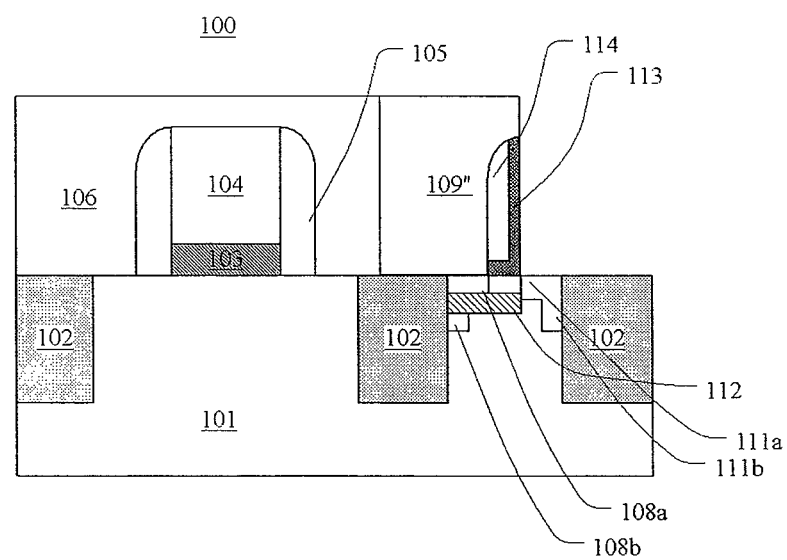

Next, similar to the step shown in FIG. 8, by employing the sacrificial spacer 110" as a hard mask, an extension region 111a and the other region 111b of the source region and the drain region are formed in the semiconductor substrate 101 by a fourth ion implantation and a fifth ion implantation, as shown in FIG. 26.

Figure 27:
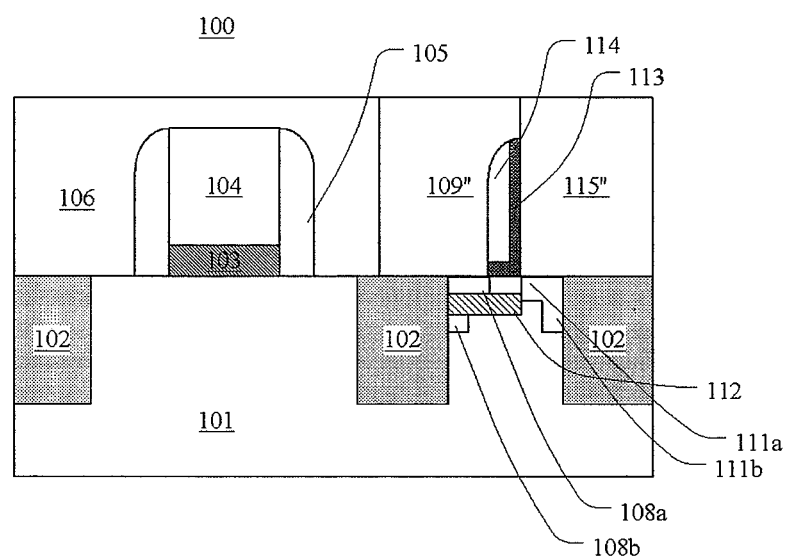

Next, similar to the step shown in FIG. 11, a dielectric layer 115''' to at least cover the second MOSFET is formed, as shown in FIG. 27.

The first embodiment, the second embodiment and the third embodiment of the disclosed technology mentioned above illustrate a step of further forming a second MOSFET after forming a conventional first MOSFET. The gate stack of the second MOSFET is formed on the sidewall of the shielding layers. Thus, the gate length of the second MOSFET may be significantly smaller than that of the first MOSFET. For example, the gate length of the second MOSFET may be about 5-20 nm.

After the steps shown in FIGS. 11, 19 and 27, an inter-layer insulating layer, a through-via in the inter-layer insulating layer and wires or electrodes on an upper surface of the inter-layer insulating layer are formed on the resultant semiconductor structure, so as to accomplish the other portions of the MOSFET.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The specific embodiments of the disclosed technology have been described herein for purposes of not limitation but illustration. The scope of the disclosed technology is only defined by the attached claims and their equivalent. Many alternatives and modifications may be made by those skilled in the art without departing from the scope of the present invention and these alternatives and modifications should fall within the scope of the disclosed technology.

What is claimed is:

1. A method of manufacturing a semiconductor device, comprising:
    forming a first MOSFET having a first gate length in a semiconductor substrate; and
    forming a second MOSFET having a second gate length in the semiconductor substrate, wherein the second gate length is less than the first gate length,
    wherein the second MOSFET has a gate stack in the form of a spacer having a gate conductor and a gate dielectric isolating the gate conductor from the semiconductor substrate and covering a bottom surface and a single sidewall only of the gate conductor two ion implanted extensions separated at a distance approximately equal to a horizontal dimension of the gate dielectric.

2. The method according to claim 1, wherein forming the second MOSFET comprises:
    forming one of a source region and a drain region of the second MOSFET by employing a shielding layer as a mask;
    forming the other one of the source region and the drain region of the second MOSFET by employing a sacrificial spacer as a mask; and
    replacing the sacrificial spacer with the gate stack.

3. The method according to claim 1, wherein forming the second MOSFET comprises:
    forming one of a source region and a drain region of the second MOSFET by employing a sacrificial spacer as a mask;
    forming the other one of the source region and the drain region of the second MOSFET by employing the sacrificial spacer as a mask; and
    replacing the sacrificial spacer with the gate stack.

4. The method according to claim 1, wherein forming the second MOSFET comprises:
    forming one of a source region and a drain region of the second MOSFET by employing a sacrificial spacer as a mask;
    replacing the sacrificial spacer with the gate stack; and
    foaming the other one of the source region and the drain region of the second MOSFET by employing a sacrificial spacer as a mask.

5. The method according to claim 2, wherein the sacrificial spacer is formed by the following:
    forming a further shielding layer having an exposed sidewall; and
    forming the sacrificial spacer on the sidewall of the further shielding layer.

6. The method according to claim 5, wherein replacing the sacrificial spacer with the gate stack comprises:
    removing the sacrificial spacer;
    forming a conformal dielectric layer which at least covers the sidewall of the further shielding layer and the surface of the semiconductor substrate;
    forming a conformal conductor layer on the dielectric layer;
    patterning the conductor layer into a gate conductor; and
    patterning the dielectric layer into a gate dielectric by employing the gate conductor as a mask.

7. The method according to claim 6, wherein the thickness of the gate conductor is substantially identical to that of the sacrificial spacer.

8. A semiconductor device, comprising:
    a semiconductor substrate;
    a first MOSFET located in the semiconductor substrate and having a first gate length; and
    a second MOSFET located in the semiconductor substrate and having a second gate length; wherein the second gate length is less than the first gate length,
    wherein the second MOSFET has a gate stack in the form of a spacer having a gate conductor and a gate dielectric located between the gate conductor and the semiconductor substrate and covering a bottom surface and a single sidewall only of the gate conductor two ion implanted extensions separated at a distance approximately equal to a horizontal dimension of the gate dielectric.

* * * * *

UNITED STATES PATENT AND TRADEMARK OFFICE
CERTIFICATE OF CORRECTION

Page 1 of 1

PATENT NO.         : 9,117,926 B2
APPLICATION NO.    : 14/144275
DATED              : August 25, 2015
INVENTOR(S)        : Huilong Zhu et al.

It is certified that error appears in the above-identified patent and that said Letters Patent is hereby corrected as shown below:

IN THE SPECIFICATION

In column 5 at line 65, Change "the the" to --the--.

In column 9 at line 5, Change "115''''" to --115''--.

IN THE CLAIMS

In column 10 at line 21, In Claim 4, change "foaming" to --forming--.

Signed and Sealed this
Fifteenth Day of March, 2016

Michelle K. Lee
*Director of the United States Patent and Trademark Office*